(12) United States Patent
Virtanen et al.

(10) Patent No.: US 8,643,379 B2
(45) Date of Patent: Feb. 4, 2014

(54) ELECTRIC SENSOR WEB, SYSTEM AND A METHOD FOR ITS MANUFACTURE

(75) Inventors: Juhani Virtanen, Tampere (FI); Kari Kyyny, Tampere (FI); Timo Joutsenoja, Tampere (FI)

(73) Assignee: Elsi Technologies Oy, Vantaa (FI)

( * ) Notice: Subject to any disclaimer, the term of this patent is extended or adjusted under 35 U.S.C. 154(b) by 568 days.

(21) Appl. No.: 12/517,854

(22) PCT Filed: Dec. 5, 2007

(86) PCT No.: PCT/FI2007/050667
§ 371 (c)(1),
(2), (4) Date: Nov. 8, 2010

(87) PCT Pub. No.: WO2008/068387
PCT Pub. Date: Jun. 12, 2008

(65) Prior Publication Data
US 2011/0050202 A1 Mar. 3, 2011

Related U.S. Application Data

(60) Provisional application No. 60/872,787, filed on Dec. 5, 2006.

(51) Int. Cl.
*G01R 29/12* (2006.01)
(52) U.S. Cl.
USPC .......................................................... 324/457
(58) Field of Classification Search
USPC ....................................................... 324/457
See application file for complete search history.

(56) References Cited

U.S. PATENT DOCUMENTS

| | | | |
|---|---|---|---|
| 4,293,987 | A | 10/1981 | Gottbreht et al. |
| 2003/0234771 | A1 | 12/2003 | Mulligan |
| 2006/0006168 | A1 | 1/2006 | Rock et al. |

FOREIGN PATENT DOCUMENTS

| | | |
|---|---|---|
| DE | 100 61 434 A1 | 6/2002 |
| EP | 1 063 134 A | 12/2000 |
| EP | 1 080 994 A | 3/2001 |
| EP | 1 361 502 A | 11/2003 |
| FR | 2 744 546 A | 8/1997 |
| WO | WO-96/13098 A | 5/1996 |
| WO | WO-97/18450 A | 5/1997 |
| WO | WO-2005/020171 A1 | 3/2005 |
| WO | WO-2005/125290 A | 12/2005 |
| WO | WO-2006/003245 A1 | 1/2006 |

OTHER PUBLICATIONS

International search report, Apr. 17, 2008, For PCT/FI2007/050667.

*Primary Examiner* — Amy He
(74) *Attorney, Agent, or Firm* — Venable LLP; Eric J. Franklin

(57) ABSTRACT

A sensor web for electric field sensing. A substrate has a longitudinal direction. At least one array of electrically conductive sensor areas follows each other in a successive manner along the longitudinal direction and is arranged on one side of the substrate. A group of conductors is on the same side of the substrate. Each electrically conductive sensor area that is to be used for sensing purposes is electrically connected to one conductor. The conductors are adapted to join one by one the group of the conductors advancing in the longitudinal direction of the substrate and the other conductors of the group are adapted to give space for the joining conductor. A method for manufacturing of a sensor web and a system for monitoring a space.

18 Claims, 18 Drawing Sheets

ELECTRIC SENSOR WEB, SYSTEM AND A METHOD FOR ITS MANUFACTURE

CROSS-REFERENCE TO RELATED APPLICATIONS

This application claims priority to U.S. provisional patent application 60/872,787 filed 5 Dec. 2006 is the national phase under 35 U.S.C. §371 of PCT/FI2007/050667 filed 5 Dec. 2007.

FIELD OF INVENTION

The present invention relates to a sensor web. The sensor web can be used for example in floor constructions for monitoring electrically conductive objects, objects with dielectric properties and objects containing charges, for example the movement and location of a human body as described for example in publication WO2005/020171A1. For example, the sensor web is useful for monitoring aged and disabled people and their vital functions. Other possible applications are monitoring of inmates in jails and prisons, home and industrial automation applications, vehicle airbag systems and other sensing applications.

The present invention also relates to a method for manufacturing of a sensor web.

BACKGROUND

Publication WO 2006/003245 discloses a sensor product for electric field sensing. The sensor product is in web form, and it comprises sequential conductive areas which have been connected to conductors. The conductors are parallel to each other.

Publication WO 2006/003245 discloses that parallel straight conductors extend in the longitudinal direction of a web. The publication teaches that there are two possibilities to arrange the contact between a conductive area and a conductor: 1) a via is formed through the web, and it is filled with conductive ink while the conductor is formed e.g. by printing on the reverse surface of the web, thus forming a conductive path through the web, 2) a dielectric bridge is formed over the conductors, and the dielectric bridge is discontinuous at the point where an electric contact is desired.

In order to achieve an easy to use and functional sensor web, the construction of the contact between the conductive area and the conductor is highly important because the web should be cuttable wherever desired.

SUMMARY OF THE INVENTION

The aim of the invention is to create a sensor web which has a simple structure and is easy to manufacture. When the sensor web, i.e. the conductive sensor area, is implemented in one plane or layer, no vias or dielectric bridges are required.

An additional benefit of the structure among some variations of the sensor web is that the patterning of the sensor electrodes and conductors can be done in simple processing steps, even as a single processing step.

Furthermore, the sensor structure presented here can also be characterized by the feature that the sensor web can be cut across the longitudinal direction of the web anywhere along this direction, and the cutoff sensor laminate will form a functional entity up to the sensor count that does not exceed the number of conductors crossing the cutting edges. Thus, during manufacturing, the structure of the sensor web is insensitive to the number of the conductive areas which are required in a specific sensor web for a given application or system to be assembled.

The sensor web comprises a substrate having a longitudinal direction, successive electrically conductive areas on the surface of the substrate and a group of parallel conductors (i.e. conductors next to each other) which advance in the longitudinal direction of the substrate. The electrically conductive areas act as capacitive sensors, which are connected to suitable electronics via the conductors. The sensor web can be manufactured by using a roll-to-roll process or—tools or any other mass production process that can take use of the identically repetitive pattern of the sensor areas in the web direction.

The substrate is in a web form. The substrate comprises plastic material, or fibrous material in the form of a nonwoven fabric, fabric, paper, or board. Suitable plastics are, for example, plastics comprising polyethylene terephtalate (PET), polypropylene (PP), or polyethylene (PE). The substrate is preferably substantially flexible in order to conform with other surfaces on which it is placed. Besides one layer structure, the substrate can comprise more layers attached to each other. The substrate may comprise layers that are laminated to each other, extruded layers, coated or printed layers, or mixtures of these. Usually, there is a protective layer on the surface of the substrate so that the protective layer covers the electrically conductive areas and the conductors. The protective layer may consist of any flexible material, for example paper, board, or plastic, such as PET, PP, or PE. The protective layer may be in the form of a nonwoven, a fabric, or a foil. A protective dielectric coating, for example an acrylic based coating, is possible.

The electrically conductive areas comprise electrically conductive material, and the electrically conductive areas can be, for example, but are not limited to, printed layers, coated layers, evaporated layers, electrodeposited layers, sputtered layers, laminated foils, etched layers, foils or fibrous layers. The electrically conductive area may comprise conductive carbon, metallic layers, metallic particles, or fibers, or electrically conductive polymers, such as polyacetylene, polyaniline, or polypyrrole. Metals that are used for forming the electrically conductive areas include for example aluminum, copper and silver. Electrically conductive carbon may be mixed in a medium in order to manufacture an ink or a coating. When a transparent sensor product is desired, electrically conductive materials, such as ITO (indium tin oxide), PEDOT (poly-(3,4-ethylenedioxythiophene)), or carbon nanotubes, can be used. For example, carbon nanotubes can be used in coatings which comprise the nanotubes and polymers. The same electrically conductive materials also apply to the conductors. Suitable techniques for forming the electrically conductive areas include, for example, etching or screen printing (flat bed or rotation), gravure, offset, flexography, inkjet printing, electrostatography, electroplating, and chemical plating.

Besides the above-mentioned methods for manufacturing the web, the following manufacturing method may be used. A metal foil, such as an aluminum foil, is laminated on a release web. The electrically conductive areas and the conductors are die-cut off the metal foil, and the remaining waste matrix is wound onto a roll. After that, a first protective film is laminated on the electrically conductive areas and the conductors. Next, the release web is removed and a backing film is laminated to replace the release web.

Benefits of the above-mentioned manufacturing method include:

the raw material is cheaper, the manufacturing method is cheaper compared to e.g. etching, the manufacturing method requires only one production line, and the resulting sensor web is thinner; the thickness of the sensor web may be less than 50 μm.

The above-mentioned manufacturing method may also be applied to such sensor webs which comprise sequential electrically conductive areas and a group of conductors which extend in the longitudinal direction of the web. Such a sensor web is known from WO 2006/003245. The electrically conductive areas and the group of conductors are die-cut from a metal foil, and they are laminated between two substrates, i.e. between two superimposed webs. In order to couple an electrically conductive area to a conductor, an electrically conductive bridge between them is necessary. Because the substrate is an electric insulator, vias through the substrate are required. The vias through one of the substrates are arranged, for example, by drilling or by perforating the substrate. Next, the vias are filled with electrically conductive ink during printing of electrically conductive bridges.

Furthermore, the manufacturing method may be applied to such sensor webs which comprise two or more superimposed layers. For example, electrically conductive areas and their conductors may be located in one layer, and optional RF loops and their conductors may be located in another layer. In principle, it is possible to use different techniques, e.g. etching, printing, or die-cutting, in the same product. For example, the electrically conductive areas may be die-cut from a metal foil, but their conductors may be etched on a substrate. The electrically conductive areas and their conductors are connected to each other through vias.

The sensor web is provided with an output in order to make it possible to connect the output to the control electronics. For example, measurement voltages and control output currents can be fed through the output. For a person skilled in the art it is clear that the nature of output signals can vary according to the application. For example, in the case of capacitive measurements, no effective current signal is available. In practice, the output can comprise conductors next to each other without any connector. In other words, the output is formed by cutting the sensor web across its longitudinal direction to a desired length, and thus the ends of the conductors are exposed and are ready for forming an electrical contact. The attachment method of the sensor web in contact can be, but is not limited to, crimp connector, spring connector, welded contact, soldered contact, isotropic or anisotropic adhesive contact. However, a standard connector used in common electronic applications (e.g. Crimpflex®, Nicomatic SA, France) can be added to the output.

Each electrically conductive area to be used for sensing is connected to a conductor which forms an electrically conductive path between the electrically conductive areas and the output. The conductors form a group of parallel conductors which each of them is adapted to join. When one conductor joins the group, each of the other conductors of the group gives space for the joining conductor so that the conductors do not cross each other. The group of conductors advance in the longitudinal direction of the substrate.

The above-mentioned principle can be implemented in different ways. For example, the parallel conductors may extend diagonally on the substrate, or the parallel conductors may sidestep when a new conductor joins the group of conductors.

The conductor may comprise only one part, i.e. the first part, or it may comprise two parts, i.e. the first and second parts. For example, the conductor may be straight throughout its length, thus consisting of only the first part, or the conductor may be formed of two straight parts which are connected to each other so that the parts form an angle to each other. It is also possible that the part which is in a physical contact with the conductive area, i.e. the second part, is curved. One possible option is that the first parts extend, for example, as waves but they have a certain linear advancing direction. Further, the conductors may wind according to a predetermined pattern so that their distance from each other is constant, i.e. the conductors are parallel despite the winding. In that case, the advancing direction is determined by connecting the starting point of the conductor, or the starting point of the first part of the conductor, to the end point (the output) of the conductor with a straight line. The straight line illustrates the advancing direction. However, the basic principle, i.e. that each of the other conductors of the group gives space for the joining conductor so that the conductors do not cross each other, is realized as well.

In certain embodiments of the invention, the conductors may be arranged in a widened manner in some positions of the web in order to ease the connections using a connector. Between such widened positions the conductors travel in the longitudinal direction of the web in an arrangement that is as narrow as possible to save space for the sensor area.

The first parts of the conductors may form an angle with the longitudinal direction of the substrate. The absolute value of the angle is greater than 0° but smaller than 90°, typically greater than 0.01° but smaller than 30°, more typically greater than 0.1° but smaller than 5°. Instead of being smaller than 5°, the upper limit may be smaller than 3°. Very useful ranges are that the absolute value of the angle is greater than 0.5° but smaller than 1.5°, or that the absolute value of the angle is greater than 0.2° but smaller than 2°. When the first parts extend, for example, as waves, the linear advancing direction of the first parts of the conductors form an angle with the longitudinal direction of the substrate. Similarly, when the straight line illustrates the advancing direction of the freely winding or curling conductor, the straight line forms an angle with the longitudinal direction of the web.

One possible way to implement the conductors is to arrange the group of the parallel conductors so that the other members of the group sidestep when a new conductor joins the group of parallel conductors. For example, the conductors may comprise a pattern which consists of a diagonal part and a part which is joined to the diagonal part and extends in the longitudinal direction of the web. The first diagonal part begins from the electrically conductive area. The pattern is repeated one after another so that the conductor is transferred in the cross-direction of the web.

A conductor structure, which is almost similar to the above-mentioned lay-out, may comprise a part which extends in the longitudinal direction of the sensor web and a part which is transverse to the first mentioned part. The parts form a step-shaped pattern which is able to sidestep when a new conductor joins the group of the conductors.

The purpose of the above-mentioned arrangement for conductors is to bring electrical leads from the conductive areas to the edge of web so that a) the conductors do not cross each other, and b) the conductors at the edge of web are equally spaced from each other. This arrangement provides a constant cross directional distance between the conductors extending from the conductive areas that are located in different positions in the web direction. Thus, no vias or dielectric bridges are required when the sensor web is implemented in one plane because the conductors can extend without crossing or disturbing each other. Such an arrangement provides an easy and reliable connection between the series of conductive areas and corresponding series of the conductors at the edge of the web with a constant distance between connectors. Furthermore, the web can be cut wherever desired and the order of the conductors in the cutting position corresponds in a known manner to the positions of the sensor areas in the sensor array as defined by their distance from the cutting position.

The sensor web comprises repetitive patterns which comprise successive and/or sequential conductive areas and their conductors. For example, one pattern may be formed from five successive conductive areas and their conductors. The above-mentioned pattern is repetitive over the length of the web.

The number of successive electrically conductive areas 1 to N in the web is defined by the total number of conductor lines arranged to run along the web direction. Typically, the number of conductors is kept constant along the web, which means that when a new conductor is adapted to join the group of successive conductors and the other conductors in this group are adapted to give space for this joining conductor, then the run of the outermost conductor on the other side of this group is terminated. Thus, the total repetitive pattern of the successive conductive areas is defined by the total number of parallel conductor lines. This number can be freely chosen according to a given application.

Besides the above-mentioned elements of the sensor web, the sensor web may include, for example, RF loops and their conductors. They may also be made of a metal foil. The RF loops and their conductors may be arranged in the same layer as the electrically conductive areas and their conductors, or the RF loops and their conductors and the electrically conductive areas and their conductors may be arranged in superimposed layers.

The sensor web may also include a continuous secondary sensor element whose parts intermesh with the electrically conductive areas. The continuous secondary sensor element can be reserved for a common signal, such as a ground signal. This kind of a solution is important for reducing the electrical noise level and thus for increasing the sensitivity of the measurement.

Further, the sensor web may comprise several arrays of successive electrically conductive areas. The electrically conductive areas do not need to be aligned in the cross direction of the web. The shape of the electrically conductive areas can be circles, squares but also any other shapes are feasible. As a skilled person will readily understand, the electrically conductive areas may have almost any imaginable shape. However, some shapes may be more beneficial than others e.g. in regard to their distribution over the sensor web and thus to the positional sensing capability of the web.

The present invention also relates to a system for monitoring a space. The space may be, for example, a single room or a group of rooms to be monitored. The system comprises a given length cut from the sensor web described in this application Thus, the length also comprises a substrate having a longitudinal direction, at least one array of successive electrically conductive areas formed on the surface of the substrate, and a group of conductors formed on the surface of the substrate. Each active electrically conductive area is electrically connected to one conductor. The conductors are adapted to join one by one the group of the conductors advancing in the longitudinal direction of the substrate, and the other conductors of the group are adapted to give space for the joining conductor. When a new conductor joins the group on one side of the group, another conductor ends approximately at the same location on the other side of the group. The length is usually mounted on a floor under the wearing surface of the floor. The system also comprises means for sending an input signal to at least one electrically conductive area and means for detecting an output signal from at least one electrically conductive area. The output signal may be, for example, a differential signal or a sum signal in addition to a single-ended signal. In a passively operating sensor system, the input signal may not be required.

BRIEF DESCRIPTION OF THE FIGURES

In the appended figures.

DETAILED DESCRIPTION

Figure 1:
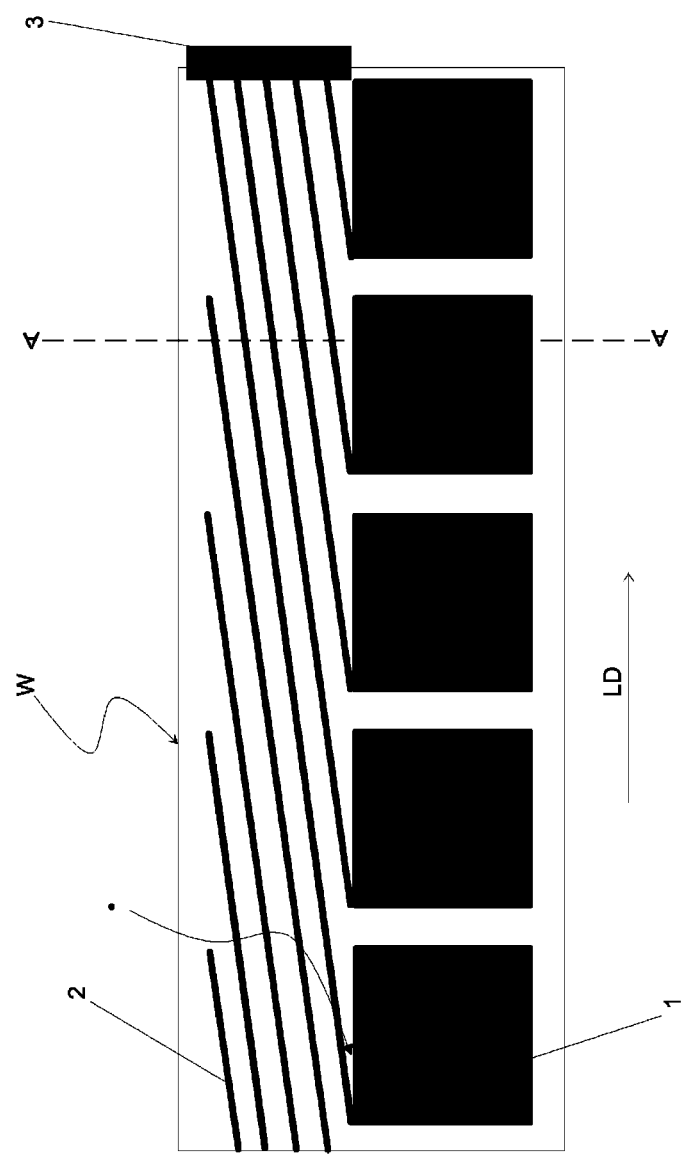
FIGS. 1 to 4 show the top views of sensor webs for monitoring conductive objects.

FIG. 1 illustrates a sensor web W for monitoring electrically conductive objects, for example the movement and location of a human body. It is possible, for example, to use the web W for monitoring aged and disabled people. Also, possible applications include but are not limited to monitoring of jails and prisons, home and industrial automation, vehicle airbag systems and other sensing applications. The sensor web W comprises successive electrically conductive areas 1. A conductor 2 connects the electrically conductive area 1 to an output 3. The output 3 is provided with a connector. The parallel conductors 2 extend linearly and form an angle α to the longitudinal direction LD of the web W.

Figure 2:
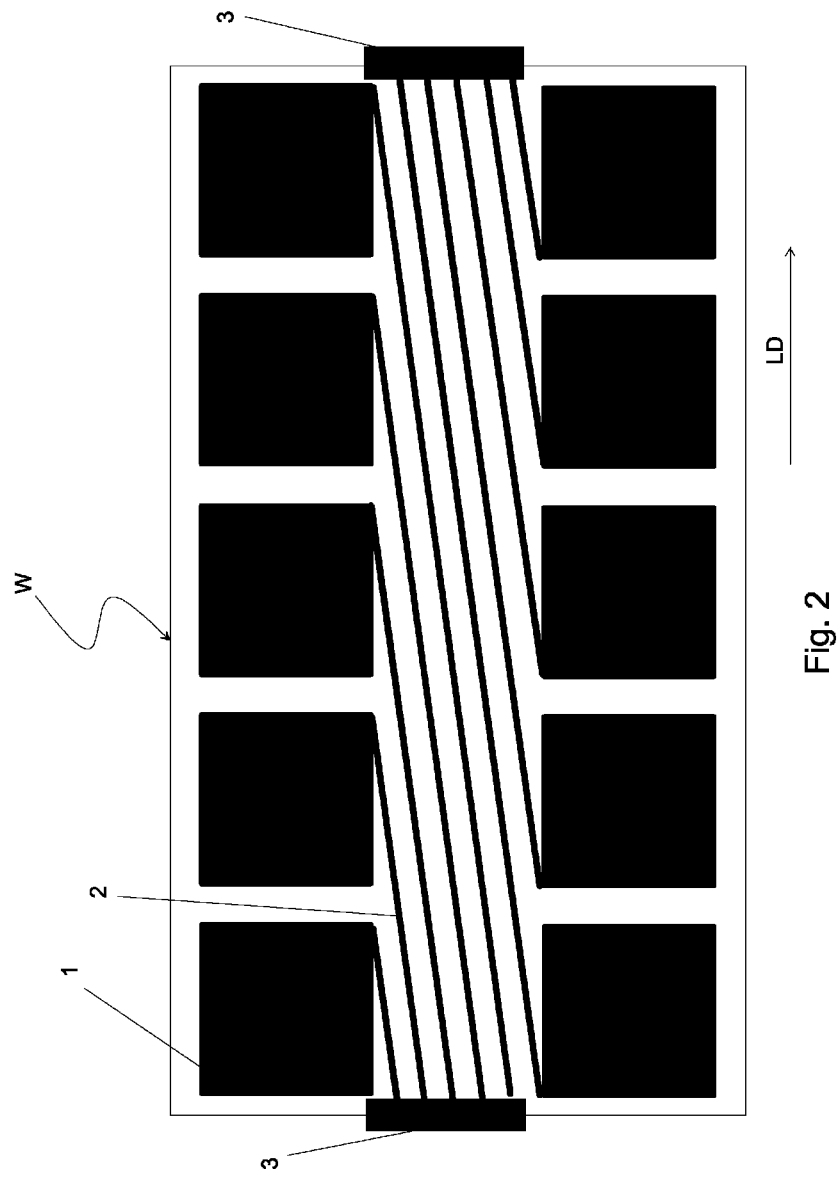

FIG. 2 shows another possible lay-out of a sensor web W. The web W comprises two rows of successive electrically conductive areas 1. Conductors 2, which connect the electrically conductive areas 1 on the upper row to an output 3 on the left hand side, are parallel to conductors 3, which connect the electrically conductive areas 1 on the lower row to an output 3 on the right hand side. The parallel conductors 2 extend linearly and form an angle to the longitudinal direction LD of the web W.

Figure 3:
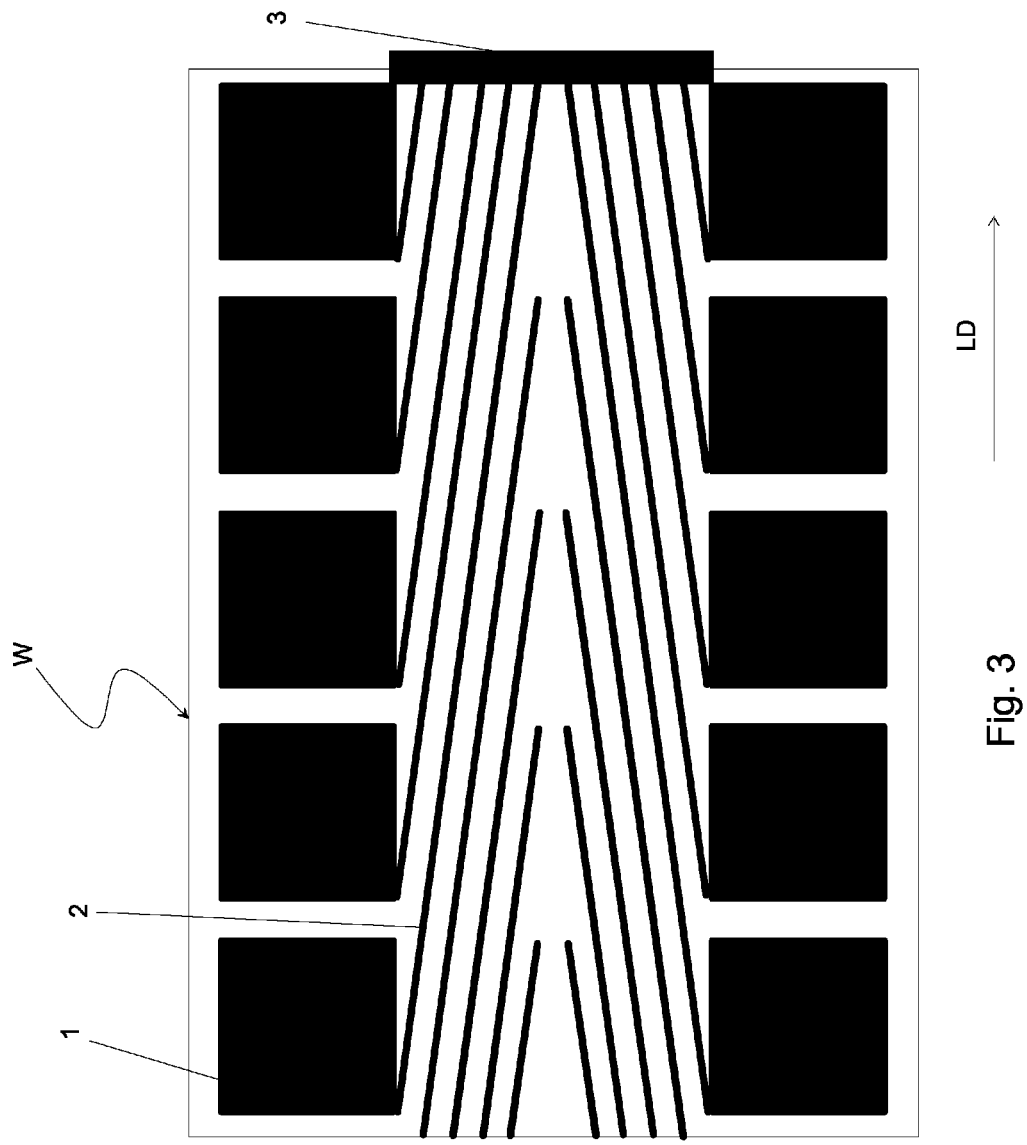

FIG. 3 shows yet another possible lay-out of a sensor web W. The web W comprises two rows of successive electrically conductive areas 1 and conductors 2 which connect the electrically conductive areas to an output 3. The electrically conductive areas 1 on the upper row and their conductors 2 and the electrically conductive areas 1 on the lower row and their conductors 2 form a mirror image. The conductors of the upper row are parallel to each other and so are the conductors of the lower row.

Figure 4:
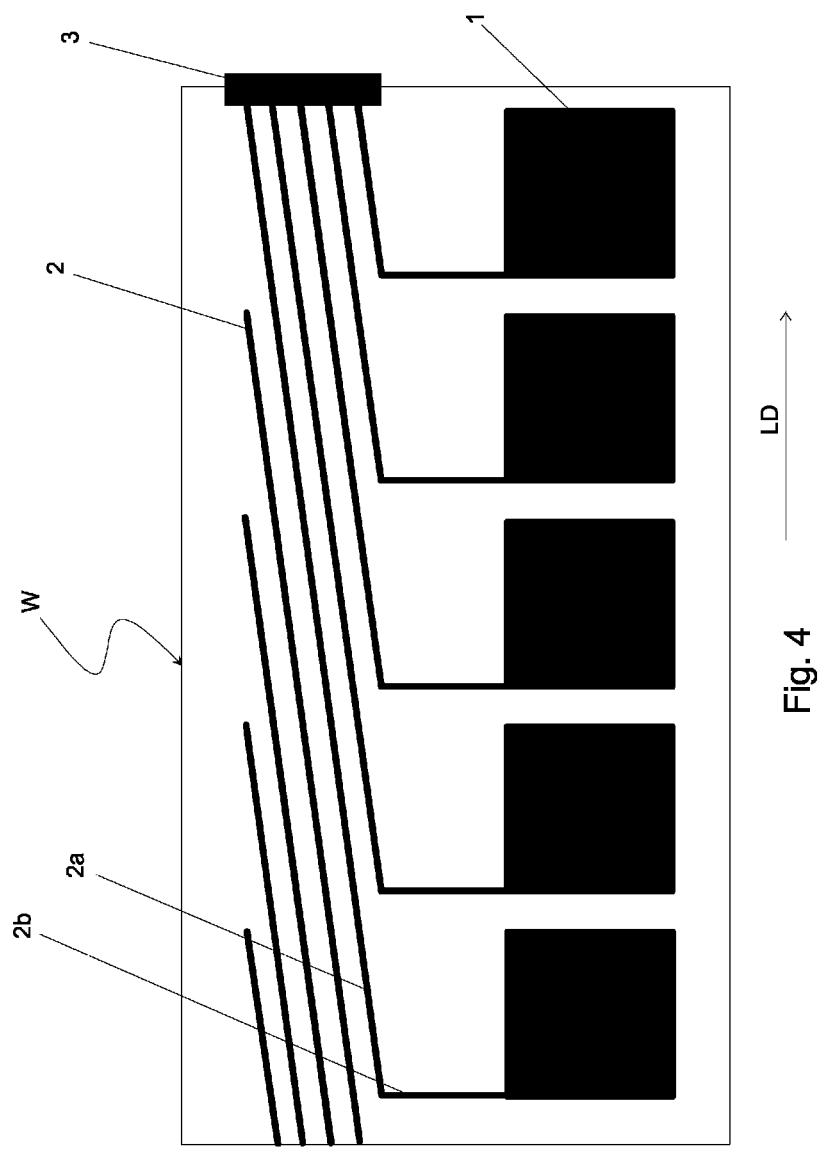

FIG. 4 further shows one possible lay-out of the sensor web W. Conductors 2 comprise first parts 2a which extend linearly, and they form an angle with the longitudinal direction LD of the web W. The conductors 2 may comprise second parts 2b which are transverse to the longitudinal direction of the sensor web W. However, the shape of the second part may vary.

Figure 5:
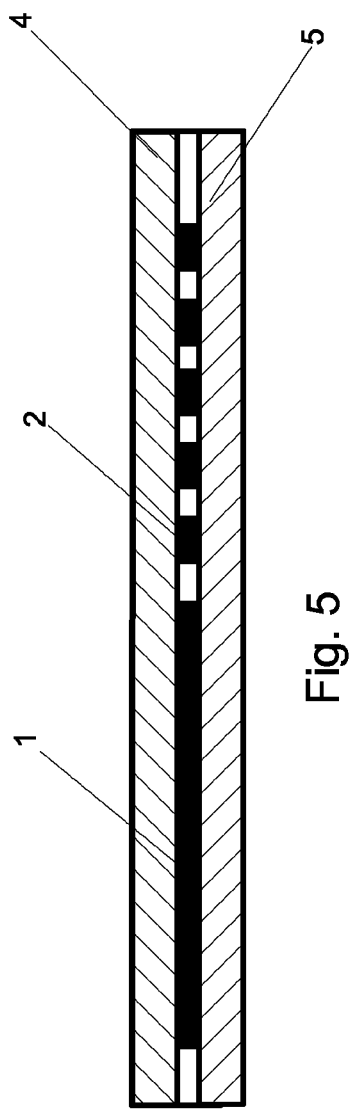
FIG. 5 shows a cross-sectional view (section A-A in FIG. 1) of the sensor web of FIGS. 1 to 4, FIGS. 6 to 9 show the top views of sensor webs for monitoring conductive objects.

FIG. 5 shows a cross-sectional view (section A-A). The sensor product comprises a substrate 5, electrically conductive areas 1 which form sensor elements formed on the surface of the substrate 5 and conductors 2 connecting the sensor elements to an output 3. The electrically conductive areas 1 may, for example, consist of etched copper. On top of the substrate 5 there is a protecting layer 4.

Figure 6:
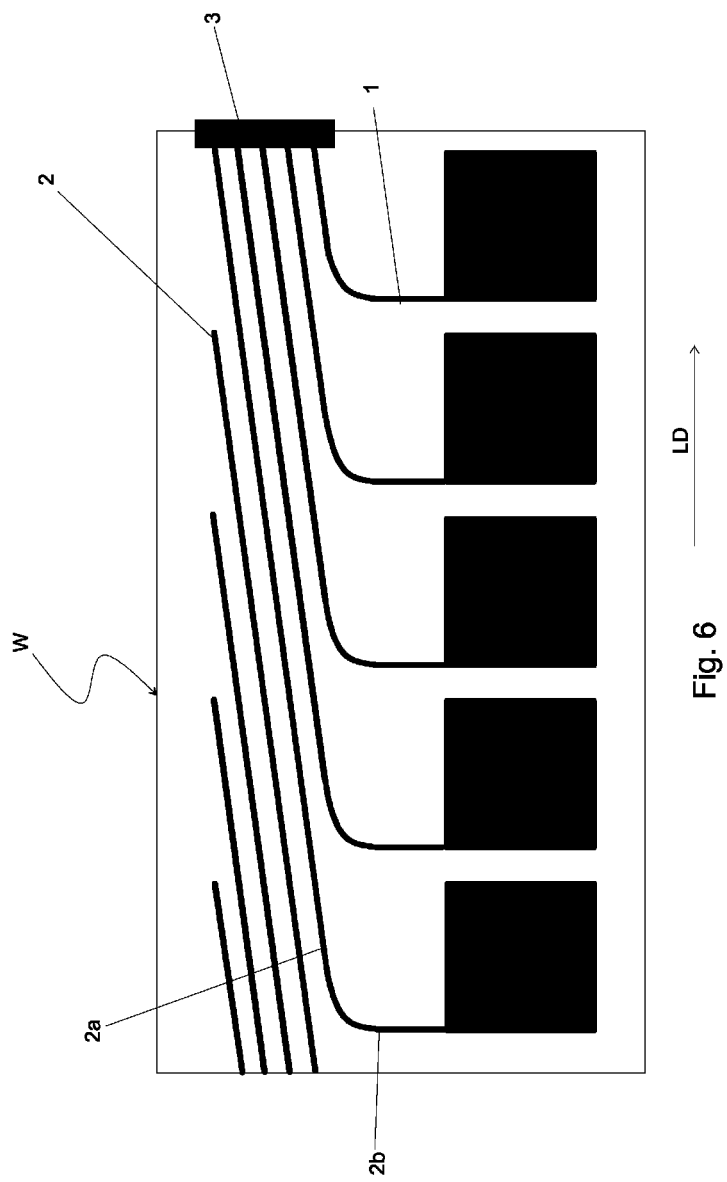

FIG. 6 shows a possible lay-out of the sensor web W. In this case, the junction of the first part 2a and the second part 2b is curved.

Figure 7:
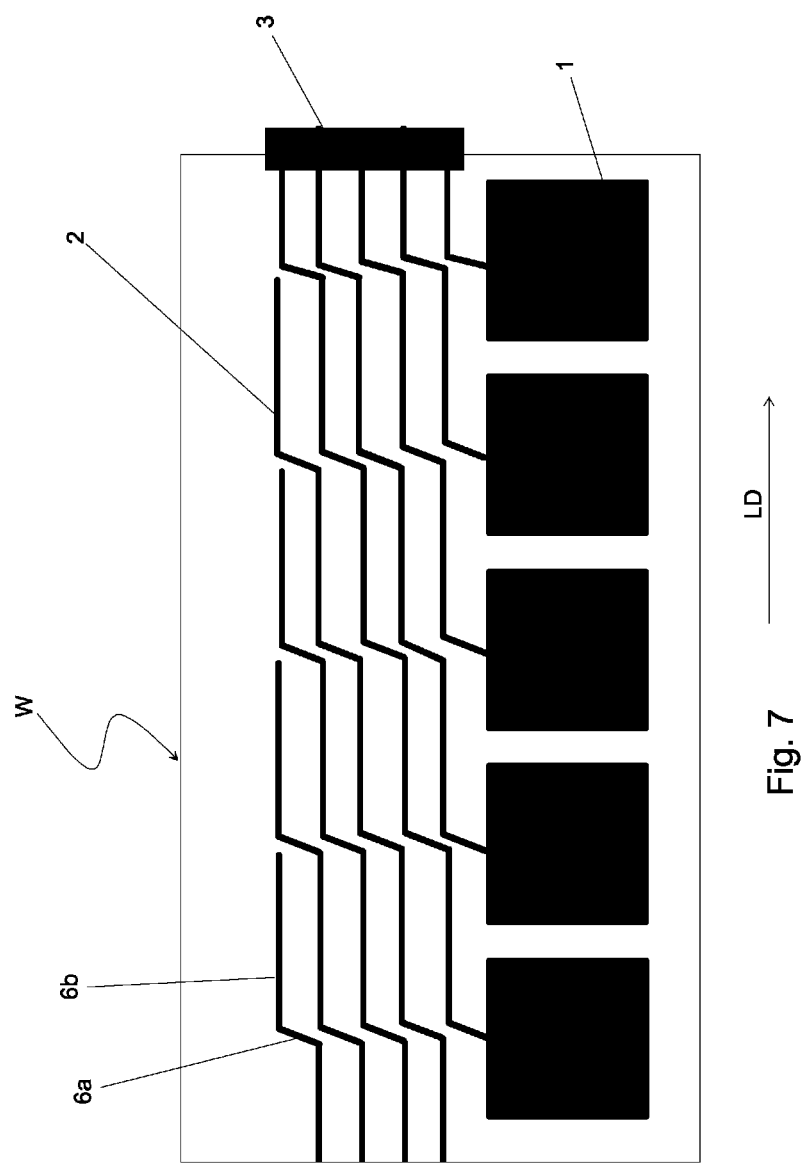

FIG. 7 shows another possible lay-out of the sensor web W. A conductor pattern consists of a part 6a and a part 6b. The part 6a is diagonal, and the part 6b extends in the longitudinal direction of the web W. The conductor pattern is repeated so that the whole conductor 2 is formed. When a new conductor 2 joins the group of the conductors, the other conductors 2 of the group are adapted to give space for the new conductor 2, i.e. the other conductors are adapted to sidestep.

Figure 8:
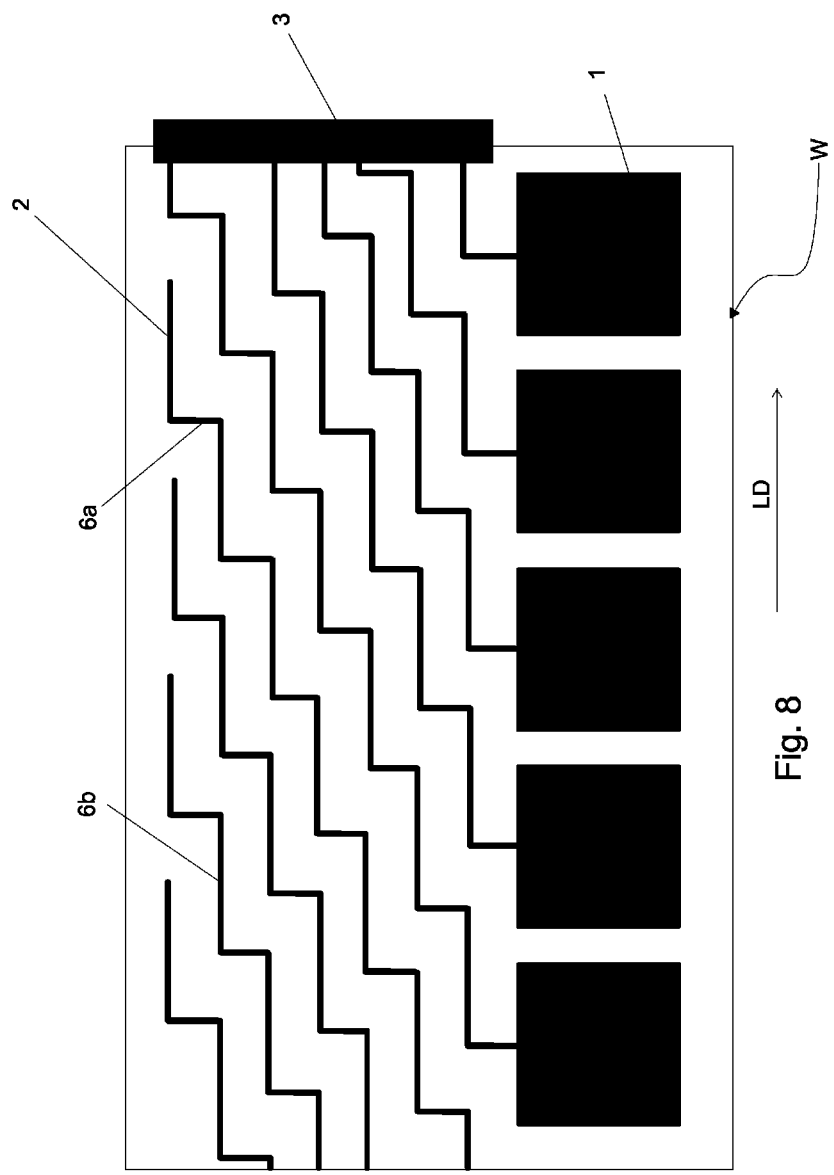

FIG. 8 shows a lay-out realized by using conductors 2 consisting of a part 6a which is parallel to the cross direction of the web W and a part 6b which extends in the longitudinal direction of the web W. Thus, the parts 6a, 6b are perpendicular to each other. When a new conductor 2 joins the group of the conductors, the other conductors 2 of the group are adapted to give space for the new conductor 2, i.e. the other conductors are adapted to sidestep.

Figure 9:
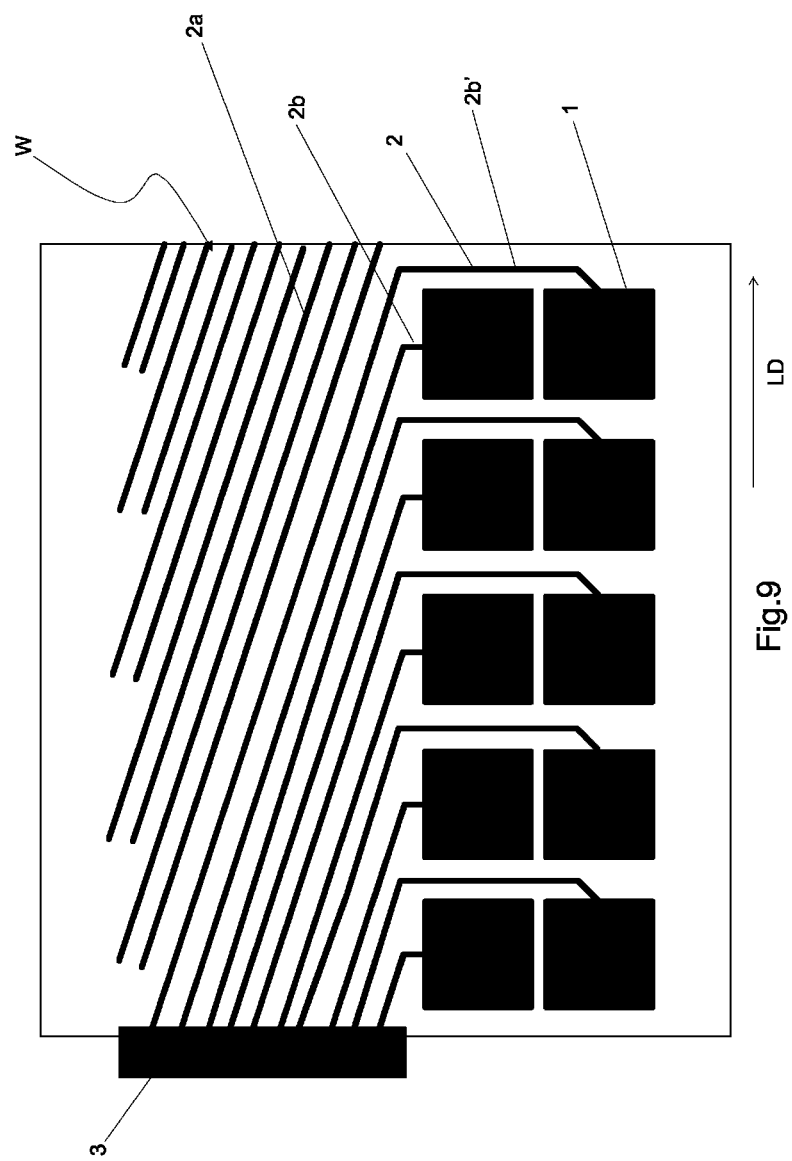

FIG. 9 shows still another possible lay-out of the sensor web W. There are two sequential arrays of conductive areas 1. Each conductive area 1 is in connection with a conductor 2. The conductors 2 comprise a first part 2a and a second part 2b or 2b'. The first parts 2a of the conductors 2 form an angle with the longitudinal direction of the substrate.

Figure 10:
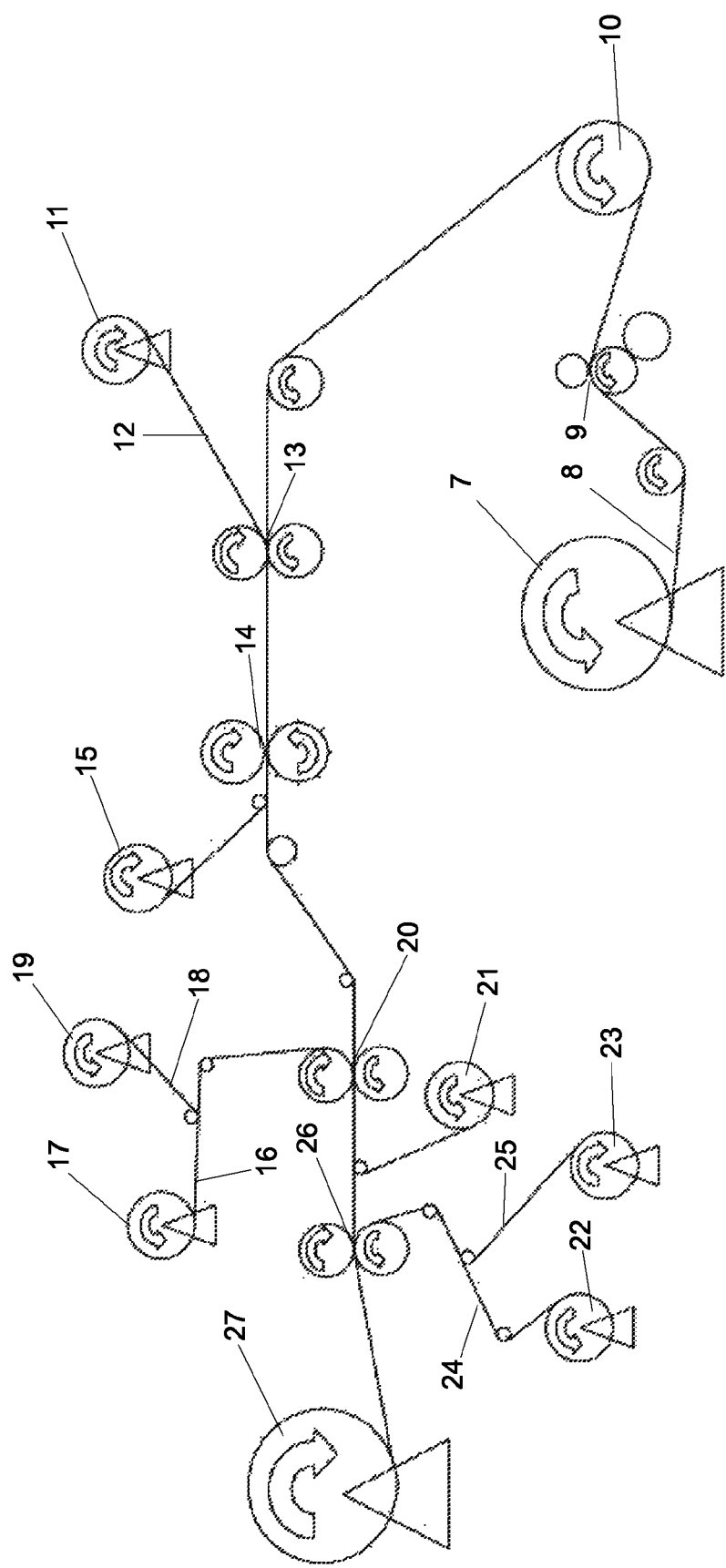
FIG. 10 shows a schematic view of a manufacturing method.

FIG. 10 shows a schematic view of a possible manufacturing method. A release web 8 is unwound from a roll 7. Hotmelt adhesive is applied on the release web 8 in a coating nip 9. After its application, the hotmelt adhesive is cooled; for the cooling, a cooling roll 10 may be used. A metal foil 12, such as an aluminium foil whose thickness may be from 5 µm to 20 µm, for example, is unwound from a roll 11. The metal foil 12 and the release web 8 are laminated together in a laminator nip 13. Next, the metal foil 12 is die-cut in a rotary die-cutter 14 in order to form the conductive areas 1 and the conductors 2, but the release web 8 remains solid. The waste matrix that is not used for the product is wound onto a roll 15.

A first protective film 16, i.e. the protective film with adhesive for the face side of the web W, is unwound from a roll 17. The protective film 16 has been provided with a release web 18 which is wound onto a roll 19. The release web 8 having the conductive areas 1 and the conductors 2 on its surface is laminated with the protective film 16 in a laminator nip 20. After that, the release web 8 is removed and wound onto a roll 21.

It is important that the first protective film 16 is immediately laminated onto the release web 8 because otherwise the conductive areas 1 and the conductors 2 made of the metal foil could be wrinkled or be otherwise damaged. They are also poorly adhered to the release web 8. Immediately means in this case that no such a process step can take place between the die-cutting step and the laminating step which could wrinkle or otherwise damage the items which are die-cut from the metal foil, i.e. there should not be e.g. any sharply turning angles or rolls having a small diameter on the production line.

A backing film 24, i.e. the protective film with adhesive for the reverse side of the web W, is unwound from a roll 22. The backing film 24 has been provided with a release web 25 which is wound onto a roll 23. The backing film 24 is laminated in a nip 26 with the first protective film 16 so that the electrically conductive areas 1 and the conductors 1 remain between the two protective films 16, 24. After the nip 26, the sensor web is wound onto a roll 27. Backing film may also be applied without adhesive and release web since there is already adhesive on the first protective film 16 and on the conductive areas.

The above-mentioned method can be used for the sensor webs which are described above and in the examples below in this application. Further, the method can be utilized in such sensor webs as described in WO 2006/003245 which discloses parallel straight conductors extending in the longitudinal direction of a web. A via may be drilled through the first or the second protective film (i.e. the backing film), and the via is filled with conductive ink, thus forming a conductive path through the web. It is also possible that the first protective film or the backing film is perforated.

Figure 11:
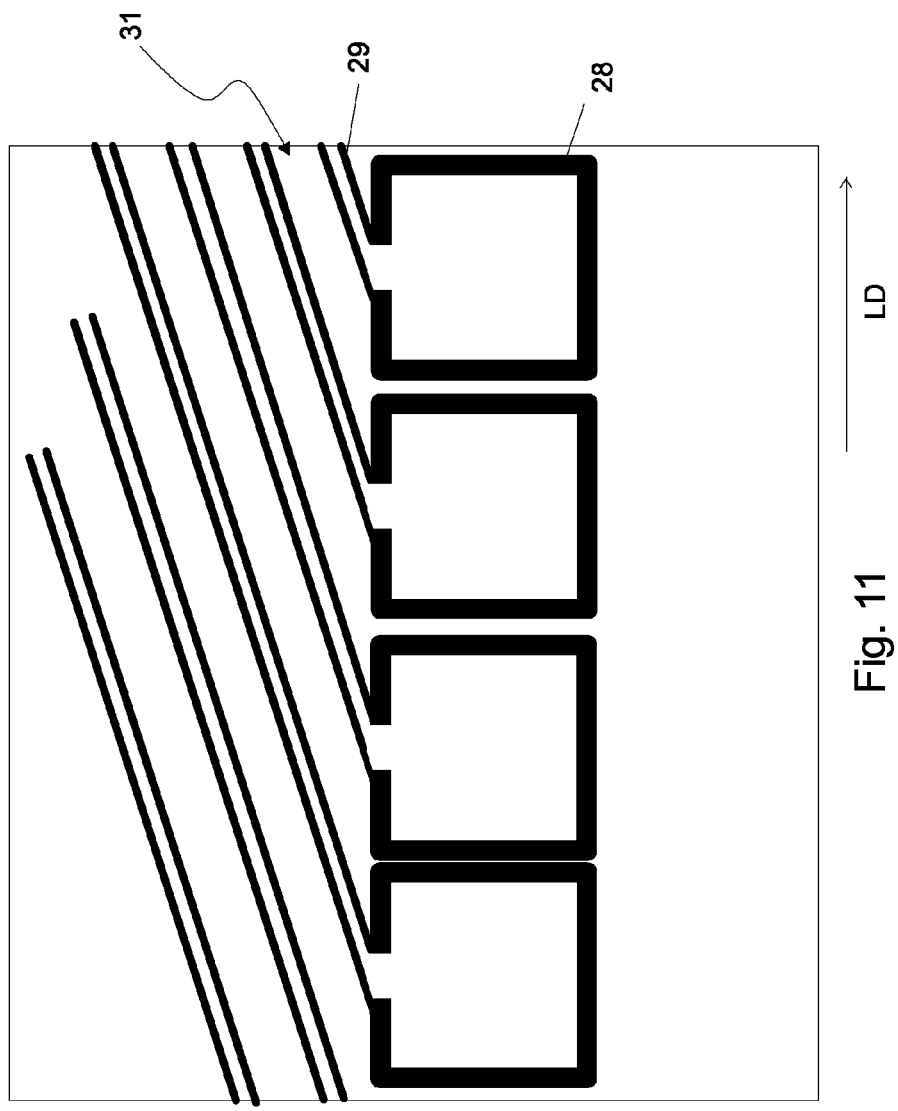
FIG. 11 shows one possible way of manufacturing RF loops.

FIG. 11 shows one possible way of manufacturing RF loops 28. The RF loops 28 and their conductors 29 are die-cut from a metal foil in a process which is similar to that process which is shown for the electrically conductive areas 1 and their conductors 2 in FIG. 10.

Figure 12:
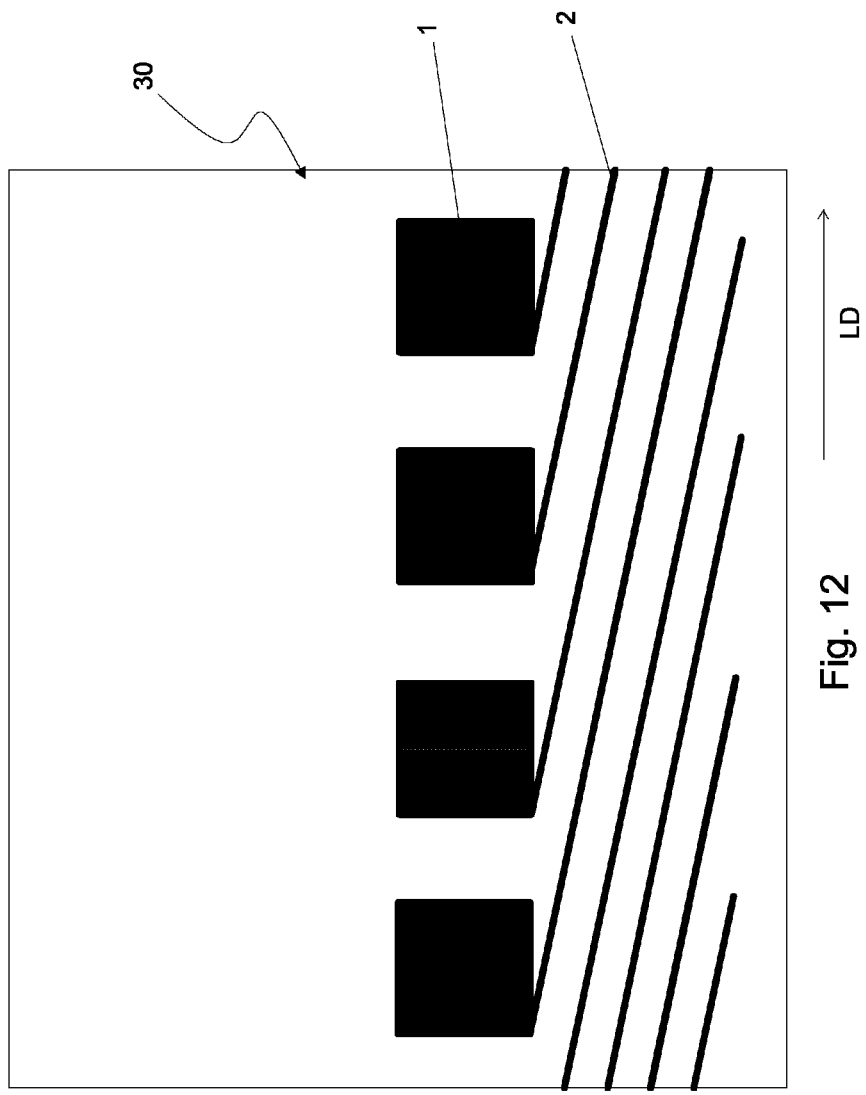
FIG. 12 shows a layer of a two-layered product.

FIG. 12 shows the first layer of a two-layered sensor web W2. The first layer comprises a substrate, electrically conductive areas 1 and their conductors 2.

Figure 13:
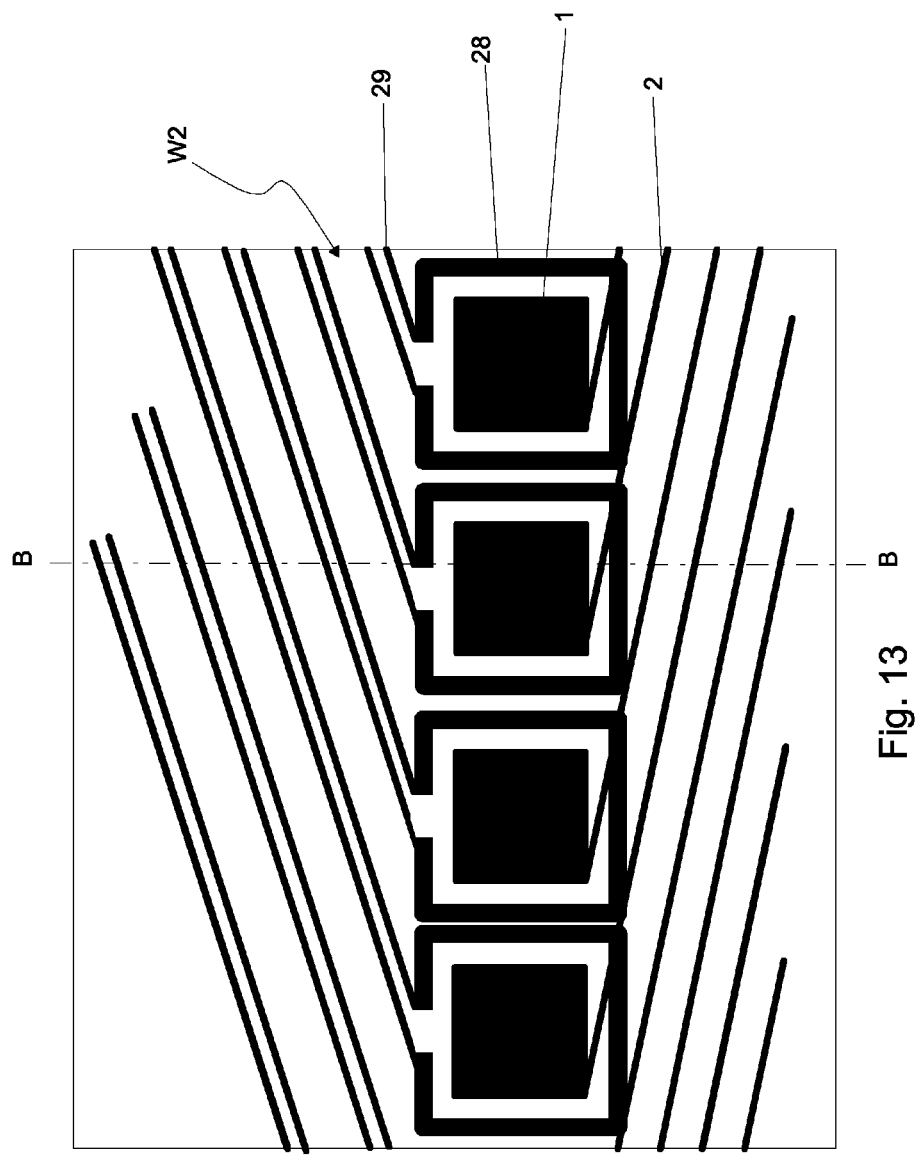
FIG. 13 shows a top view of a two-layered product.

FIG. 13 shows a two-layered sensor web W2. The sensor web W2 is illustrated as being transparent so that the first layer can be seen trough the second layer. The first layer is as illustrated in FIG. 12, i.e. the first layer comprises electrically conductive areas 1 and their conductors 2. The second layer is as illustrated in FIG. 11, i.e. the second layer comprises RF-loops 28 and their conductors 29.

Figure 14:
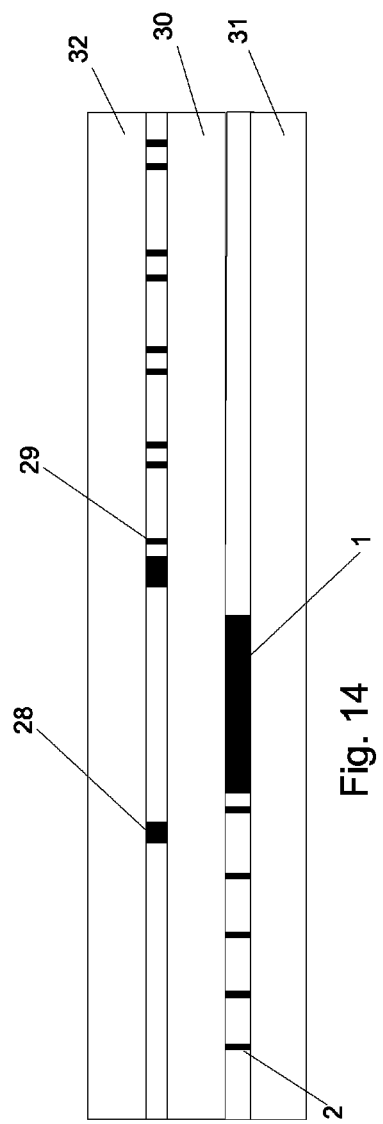
FIG. 14 shows a cross sectional view of a two-layered product (section B-B in FIG. 13)

FIG. 14 shows a cross-sectional view of the sensor web of FIG. 13 (section B-B). The sensor web comprises two layers, the first layer 30 and the second layer 31 which are attached to each other. The layers may be attached by using e.g. adhesive. The first layer 30 comprises RF loops 28 and their conductors 29. The second layer 31 comprises electrically conductive areas 1 and their conductors 2. The first layer 30 may be covered by a third layer 32. The first layer 30 and the third layer 32 may be adhesively attached to each other. It is possible to connect the conductors of both layers 30, 31 to the same connector by using a crimp connector which partially breaks the structure of the sensor web at the connector.

The two-layered web may be manufactured so that both of the layers are manufactured separately, i.e. the electrically conductive areas and their conductors on one release web are attached to one protective film, and the RF loops and their conductors on another release web are attached to another protective film. One of the release webs is removed, and the protective films are laminated together. A backing film is attached to cover those elements which remain exposed, i.e. either the electrically conductive areas and their conductors, or the RF loops and their conductors.

Figure 15:
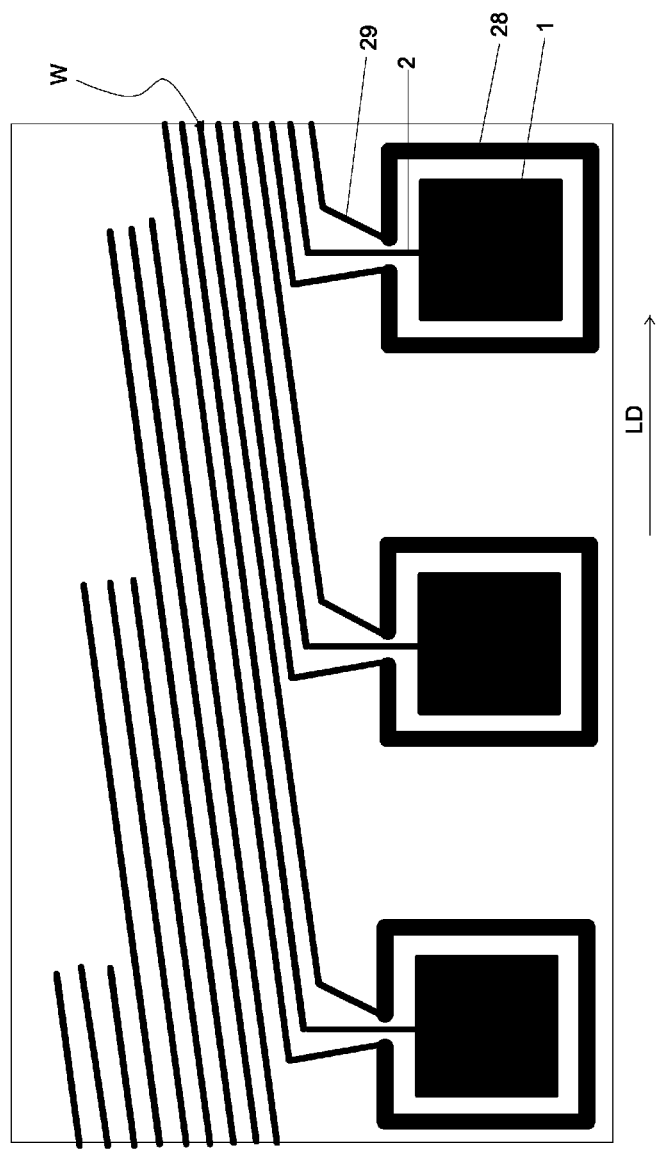
FIG. 15 shows one possible lay-out of a product comprising electrically conductive areas and RF loops.

FIG. 15 shows a top view of a sensor web W comprising electrically conductive areas 1, conductors 2 of the electrically conductive areas, RF loops 28 and conductors 29 of the RF loops. When the conductors 2 of the electrically conductive areas 1 and the conductors 29 of the RF loops 28 intermesh, as shown in FIG. 15, it is possible to arrange all the required elements, i.e. the electrically conductive areas 1, the RF loops 28 and the conductors 2, 29, to only one layer.

Figure 16:
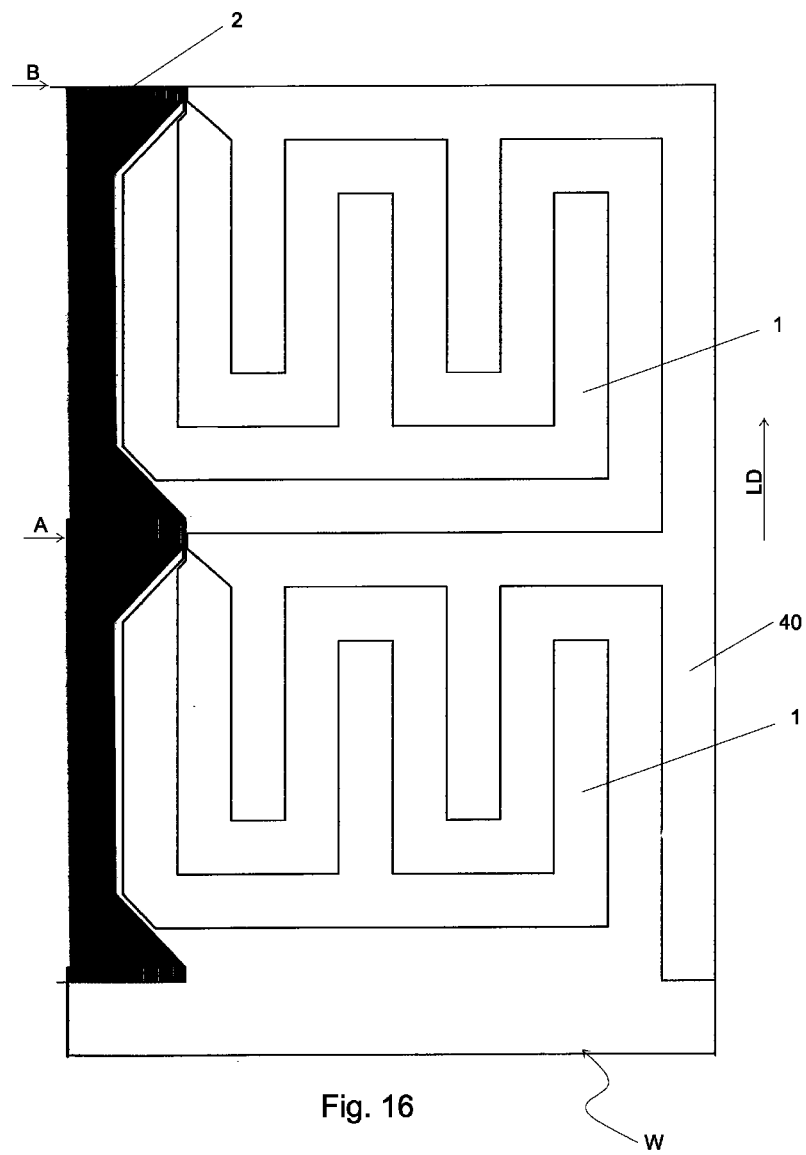
FIGS. 16 and 17 show top views of sensor webs for monitoring conductive objects.
Figure 17:
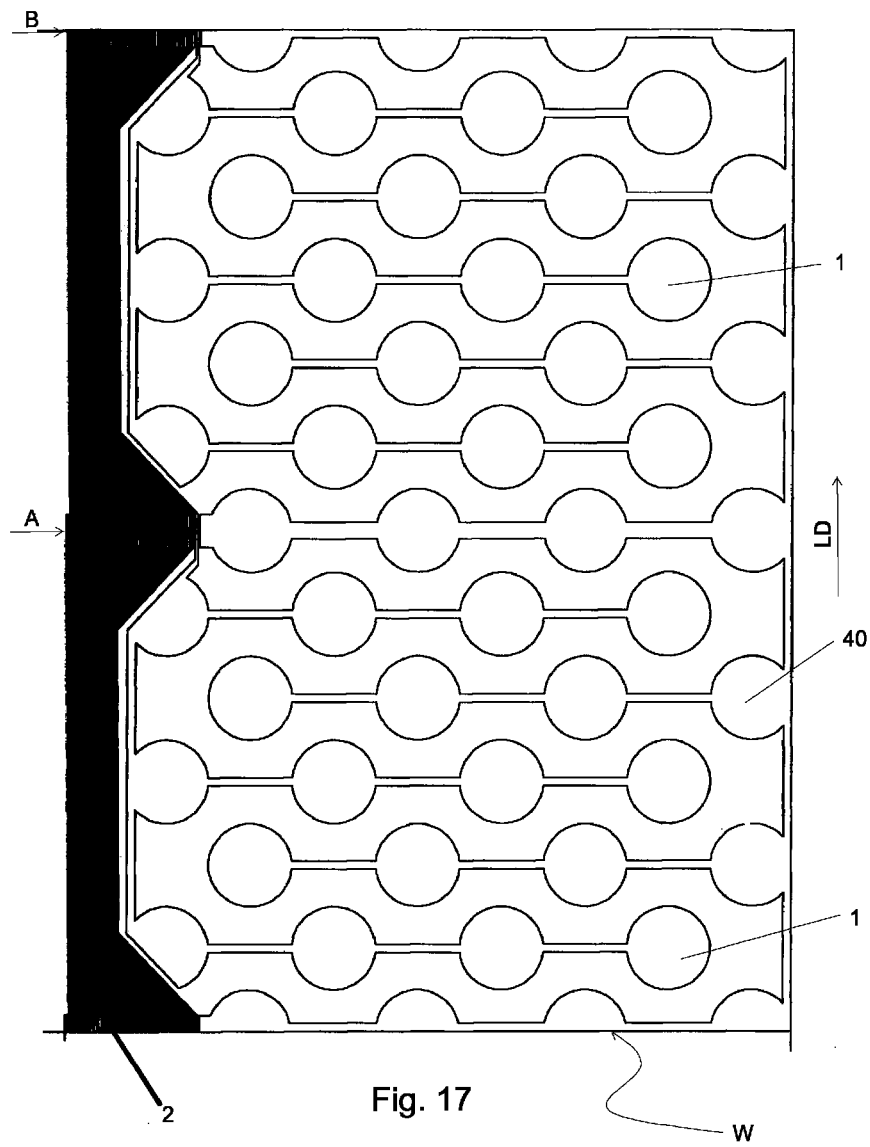

FIGS. 16 and 17 show top views of a sensor web W. A common feature in these drawings is that the area which has been reserved for conductors 2 is made very narrow compared to the whole width of the area on which both conductive areas 1 and conductors 2 exist. The width of the area which has been reserved for the conductors 1 might be 15%, preferably 10%, of the total width of the area on which the conductive areas 1 and the conductors 2 are situated. The reason for this arrangement is that the conductive areas 1 should have as much space as possible reserved for sensing use. The conductive areas 1 and the conductors 2 are situated on the same side of the web. The webs of FIGS. 16 and 17 are also provided with a continuous secondary sensor element 40 which has been reserved for a common signal, such as a ground signal. The ground signal and the shape of the conductive areas 1 can be used to have an effect on the noise level of the signals and thus, for enhancing the sensitivity of the sensors. The use of the ground signal is not obligatory but may be used in applications requiring sensitivity and less electrical noise.

Depending on the application, the ground signal or other common signal may skip some of the electrically conductive areas 1, and may instead be arranged to only every second up to every nth conductive area 1, for example.

In the embodiment illustrated in FIG. 9, for example, the conductive areas 1, arranged side by side and forming, in principle, sensor area pairs, can be used in such a manner that the first one of the sensor areas in such a pair can be used as a ground signal against which the signal from the second area in that same pair can be measured. Further, the ground signal areas in different pairs can be connected together into a common ground level or they can be kept separate.

In the embodiment illustrated in FIG. 1, for example, each of the conductive areas 1 can be encircled with guard rings providing a secondary sensor element to be used, for example, as a ground signal. Such guard rings may enclose the conductive area from all directions except leaving a route for the conductor 2b. Again, such guard rings may all be connected together to provide a common secondary sensor/signal or they can be kept separate, for example, for differential measurement purposes.

In FIG. 16, the conductive areas 1 and the continuous secondary sensor element 40 form a pattern which resembles crossing fingers, i.e. the conductive areas 1 have the shape of the letter "E" and the continuous secondary sensor element 40 has a part which resembles the mirror image of the letter "E", and the shape of the letter "E" and its mirror image intermesh.

In FIG. 17, the pattern follows the same principle as in FIG. 16 but the conductive areas 1 and the continuous secondary sensor element have been accomplished by circular shapes connected with narrow conductors.

In order to simplify the electrical connection to the sensor web, the group of conductors 2 has been widened in the cross web direction in locations A and B as shown in FIGS. 16 and 17 to adapt more readily to a connector or another connection arrangement. The web is preferably cut at these locations so that the connector can be simply arranged at the edge of the web. Naturally, the other end of the web for any given length can be cut anywhere along the web direction without affecting the functionality of the sensors.

When the web is cut at a desired location (for example connector locations A or B), the mutual order of the conductors 2 with respect to the location of an electrically conductive area 1 as defined from the cutting location, i.e. the connector location, is known. For example, in cutting/connector location A (see FIGS. 16 and 17), the 1st conductor is always the common signal (ground), the 2nd conductor is the closest sensor (sensor 1) as counted from the cutting location. For location B, again the 1st conductor is the common signal, the 2nd conductor is the closest sensor (sensor 2) from the cutting location and the 3rd conductor is the next sensor (sensor 1).

Figure 18:
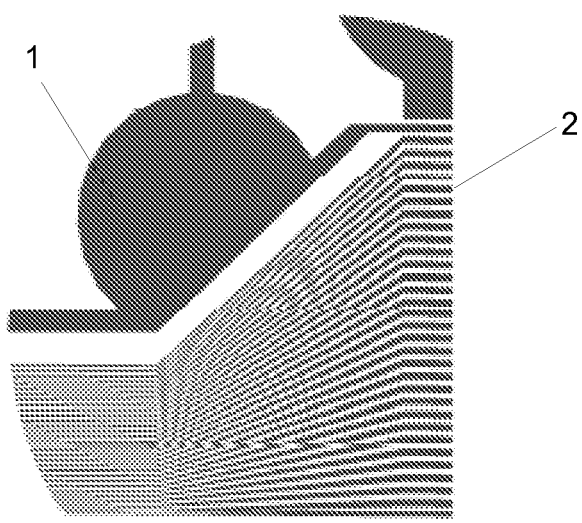
FIG. 18 shows a magnified view of specifics of FIG. 17.

FIG. 18 shows a magnified view of specifics of FIG. 17. FIG. 18 illustrates how the group of conductors have been widened and how a conductor 2 joins a group of conductors.

Throughout this application, the term "successive" is used when describing the mutual positioning of the sensor areas within an array consisting of such sensor areas. These arrays again will follow each other in a repetitive manner along the longitudinal direction of the web. Successive sensor areas are not limited here to embodiments where such areas follow each other along the longitudinal direction so that the area of the previous sensor needs to end in the longitudinal direction before the area of the successive sensor begins. It is also possible that these two or more sensor areas "overlap" each other in the cross web direction so that both sensors run side-by-side for a certain length of the web. All embodiments that are arranged to have galvanically separated sensor areas provided along the longitudinal direction of the web in some manner where this patterning advances along said longitudinal direction, are possible. The sensor areas within an array do not need to form any specific sequence.

In the following, the invention will be described by examples:

EXAMPLE 1

A sensor web according to the invention is manufactured. The metal parts can be made of, for example, etched aluminium or copper, and the polymer parts of, for example, PET, PP or PE.

Manufacturing Steps:

1. Patterns of continuous conductor lines and conductive sensor areas are first printed, for example, on the copper/PET or aluminum/PET laminate with an UV etch resist (e.g. Coates XV1000).
2. The metal outside the resist area is removed by etching. (After that, also the resist layer may be removed.)
3. Protective layers are coated or laminated (e.g. PET, PP or PE-film)
4. Connector and/or electronics is attached The resist printing can be made by any common printing technique, for example by screen printing (flat bed or rotation), gravure, offset, or flexography.

The etching can be made by any common etching process, for example a process based on ferric chloride, sodium hydroxide, or hydrogen chloride.

EXAMPLE 2

Conductive areas include, for example, conductive silver or carbon, and polymer parts consist of PET, PP or PE.

1. Continuous conductor lines and conductive sensor areas are printed with conductive paste (e.g. silver or carbon paste) onto the substrate
2. Protective layers are coated or laminated (e.g. PET, PP or PE-film)
3. Connector and/or electronics is attached Conductors and sensors can be printed by any common printing technique, such as, for example screen printing (flat bed or rotation), gravure, offset or flexography.

EXAMPLE 3

1. Continuous conductor lines and conductive sensor areas are die-cut, for example, from copper/PET or aluminum/PET laminate 2. Protective layers are coated or laminated (e.g. PET, PP or PE-film)
3. Connector and/or electronics is attached A skilled person will readily understand that all the features of the sensor web are interchangeable. If a certain feature is explained in connection with a certain sensor web, it is clear that the feature can be replaced by such a feature which is explained in connection with another sensor web.

The invention claimed is:

1. A sensor web for electric field sensing, comprising:
   a substrate having a longitudinal direction,
   at least one array of electrically conductive sensor areas formed on a surface of the substrate in the longitudinal direction of the substrate,
   a group of parallel conductors formed on the surface of the substrate, each electrically conductive sensor area being electrically connected to one conductor, wherein the parallel conductors are spaced from each other and arranged in a sidestep manner in the longitudinal direction of the substrate, wherein the conductors formed on the substrate provide space for subsequently added conductors, wherein the substrate is adapted to be cut between any two electrically conductive sensor areas to make functional sensor arrays.

2. The sensor web according to claim 1, wherein the conductors have first parts extending towards an output, the first parts of the conductors forming an angle to the longitudinal direction of the substrate, the absolute value of the angle being greater than 0° but smaller than 90°.

3. The sensor web according to claim 2, wherein an absolute value of the angle is greater than 0.1° but smaller than 5°.

4. The sensor web according to claim 1, further comprising:
   a continuous secondary sensor element for a common signal.

5. The sensor web according to claim 1, wherein the electrically conductive areas or conductors comprise a printed, coated, electrodeposited, evaporated, sputtered, etched, or laminated layer.

6. The sensor web according to claim 1, wherein the electrically conductive areas or conductors comprise a metallic layer, an electrically conductive plastic layer, or an electrically conductive fibrous layer.

7. The sensor web according to claim 1, wherein the electrically conductive areas or conductors comprise conductive carbon, or electrically conductive polymers.

8. The sensor web according claim 1, wherein the substrate is a film comprising polymer material, paper, or board, non-woven or textile material.

9. The sensor web according to claim 1, further comprising:
   a top layer comprising a film of plastic material, paper, or board, or a dielectric coating.

10. A method for manufacturing of a sensor web, the method comprising:
    die-cutting a metal foil attached to a surface of a release web to form electrically conductive areas and conductors electrically connected to the electrically conductive areas, wherein the conductors are formed parallel to each other, spaced from each other and in a sidestep manner such that conductors are adapted to be added one by one to the group of conductors advancing in the longitudinal direction of the substrate, wherein conductors formed on the substrate provide space for subsequently added conductors, wherein the substrate is adapted to be cut between any two electrically conductive sensor areas to make functional sensor arrays,
    attaching a first protective film to the release web so that the first protective film covers the electrically conductive areas and conductors, and
    replacing the release web with a backing film.

11. The method according to claim 10, further comprising:
    die-cutting the metal foil attached to the surface of the release web to form RF loops and conductors so that the RF loops and conductors are formed in a same process step as the electrically conductive areas and conductors, and
    attaching the first protective film to the release web so that the first protective film covers the electrically conductive areas and conductors and the RF loops and conductors.

12. The method according to claim 10, further comprising:
    die-cutting a metal foil attached to a surface of a second release web to form RF loops and conductors so that the RF loops and conductors are formed in a different process step as the electrically conductive areas and conductors, and
    attaching a second protective film to the second release web so that the second protective film the RF loops and conductors.

13. The method according to claim 12, further comprising:
    removing one of the release webs, and
    superimposing the first protective film and the second protective film.

14. The method according to claim 13, wherein the first protective film and the second protective film are laminated together.

15. The method according to claim 14, wherein the first protective film or the backing film is provided with vias.

16. The method according to claim 15, wherein the vias are filled with electrically conductive ink during printing of conductive bridges.

17. A system for monitoring a space, the system comprising:
    at least one length from a sensor web comprising a substrate having a longitudinal direction, at least one array of electrically conductive sensor areas formed one after another spaced apart from each other in a successive manner along the longitudinal direction and arranged on one side of the substrate, and a group of parallel conductors formed on the same side of the substrate, each electrically conductive sensor area being electrically connected to one conductor, wherein the parallel conductors are spaced from each other and arranged in a sidestep manner in the longitudinal direction of the substrate, wherein the conductors formed on the substrate provide space for subsequently added conductors, wherein the substrate is adapted to be cut between any two electrically conductive sensor areas to make functional sensor arrays, each electrically conductive area that is to be used for sensing purposes being electrically connected to one conductor, and
    a detector configured to detect an output signal from at least one electrically conductive area.

18. The system according to claim 17, wherein several lengths of the sensor web are arranged to cover a larger area within a given space and arranged to electronically monitor said space.

* * * * *